United States Patent
McNulty et al.

(10) Patent No.: US 6,686,676 B2
(45) Date of Patent: Feb. 3, 2004

(54) UV REFLECTORS AND UV-BASED LIGHT SOURCES HAVING REDUCED UV RADIATION LEAKAGE INCORPORATING THE SAME

(75) Inventors: Thomas Francis McNulty, Ballston Lake, NY (US); Daniel Darcy Doxsee, Sagamore Hills, OH (US); James Wilson Rose, Guilderland, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/681,560

(22) Filed: Apr. 30, 2001

(65) Prior Publication Data

US 2002/0180351 A1 Dec. 5, 2002

(51) Int. Cl.[7] .............. H01K 1/30; H01K 1/26; H01J 5/16; H01J 61/40; G02B 5/20
(52) U.S. Cl. .................... 313/112; 359/359
(58) Field of Search .................. 313/539, 498, 313/502, 506, 507, 112, 113, 114, 512; 362/293, 257; 257/98, 100; 359/359

(56) References Cited

U.S. PATENT DOCUMENTS

| | | | |
|---|---|---|---|
| 5,813,752 A | 9/1998 | Singer et al. | 362/293 |
| 5,813,753 A | 9/1998 | Vriens et al. | 362/293 |
| 5,923,471 A * | 7/1999 | Wood et al. | 359/359 |
| 5,933,273 A * | 8/1999 | Ferrante et al. | 359/359 |
| 6,066,861 A * | 5/2000 | Hohn et al. | 252/301.36 |
| 6,069,440 A | 5/2000 | Shimizu et al. | 313/486 |
| 6,294,800 B1 * | 9/2001 | Duggal et al. | 313/116 |
| 6,340,824 B1 * | 1/2002 | Komoto et al. | 257/99 |
| 2002/0084745 A1 * | 7/2002 | Wang et al. | 313/498 |

OTHER PUBLICATIONS

Ronald W. Wynand and Marwood N. Ediger (Ed.), "Electro–Optics Handbook," McGraw–Hill, Inc., pp. 11.13–11.38 (2000) (No month).
Eugene Hecht, Optics, Addison Wesley Longman, pp. 72–73 and 94 (1998) (No month).
Warren J. Smith, "Modern Optical Engineering" McGraw–Hill, Inc., pp. 189–201 (200) (No month).
Richard Tilley, "Colour and the Optical Properties of Materials," John Wiley and Sons Ltd., pp. 110–113 (2000) (No month).

* cited by examiner

Primary Examiner—Sandra O'Shea
Assistant Examiner—Peter Macchiarolo
(74) Attorney, Agent, or Firm—Toan P. Vo; Patrick K. Patnode

(57) ABSTRACT

UV reflectors incorporated in UV LED-based light sources reduce the amount of UV radiation emission into the surroundings and increase the efficiency of such light sources. UV reflectors are made of nanometer-sized particles having a mean particle diameter less than about one-tenth of the wavelength of the UV light emitted by the UV LED, dispersed in a molding or casting material surrounding the LED. Other UV reflectors are series of layers of materials having alternating high and low refractive indices; each layer has a physical thickness of one quarter of the wavelength divided by the refractive index of the material. Nanometer-sized textures formed on a surface of the multilayered reflector further reduce the emission of UV radiation into the surroundings. UV LED-based light sources include such a multilayered reflector disposed on an encapsulating structure of a transparent material around a UV LED, particles of a UV-excitable phosphor dispersed in the transparent material. Alternatively, the transparent material also includes nanometer-sized particles of a UV-radiation scattering material.

53 Claims, 7 Drawing Sheets

UV REFLECTORS AND UV-BASED LIGHT SOURCES HAVING REDUCED UV RADIATION LEAKAGE INCORPORATING THE SAME

BACKGROUND OF THE INVENTION

The present invention relates to ultraviolet ("UV") reflectors and UV-based light sources incorporating the same. More particularly, the present invention relates to visible light sources that are based on semiconductor UV light-emitting devices and have reduced UV emission to the surroundings.

Semiconductor light-emitting diodes and laser diodes (hereinafter collectively called "LEDs") have gained importance as light sources in many applications because of their low power consumption with relatively good luminescence efficiency and of recent advances in manufacturing technology of GaN-based semiconductor devices. Light sources have been disclosed in which radiation or light from UV light- or blue light-emitting LEDs is converted to light having generally longer wavelengths, particularly in the visible range. In the present invention disclosure, the terms "radiation" and "light" are used interchangeably to mean electromagnetic radiation having wavelengths in the range from UV to infrared; i.e, from about 100 nm to about 1 mm.

One common method for generating visible light from LEDs is to dispose a phosphor composition adjacent to the LED to convert radiation emitted by the LED to visible light. LED-based lighting devices that use phosphors in a dispersed layer around the LED for light conversion often suffer from the undesirable halo effect and the penumbra effect. The halo effect occurs because of the poor mixing of light emitted by the phosphor and that by the LED. The LED generally emits light of one wavelength range; i.e., of one color, in a directional, anisotropic fashion. However, the dispersed phosphor emits light of another wavelength range; i.e., of a different color, isotropically (i.e., in all directions). Therefore, the light output from the system appears to have different colors when it is viewed at different angles. When light from such a light source is directed onto a flat surface, it appears as a halo of one color surrounding another color. The penumbra effect is similar to the halo effect, except that the halo effect is an effect of poor color mixing, while the penumbra effect is an effect of non-uniform light intensity. The penumbra effect causes the LED-based light source to appear brighter at the center than at the edges. As noted above, the LED emission is directional, while the phosphor emission is isotropic. Therefore, the overall light emitted by the LED-based light source appears brighter at the center because the LED chip emission intensity is greatest in this region. In order to remedy these problems, particles of a color diffuser can be added into the phosphor layer to mix the colors emitted by the LED and the phosphor. For example, U.S. Pat. No. 6,066,861 briefly discloses the use of CaF2 as a diffuser for "optimizing the luminous pattern of the component." Similarly, U.S. Pat. No. 6,069,440 mentions the use of a "dispersant"; such as barium titanate, titanium oxide, aluminum oxide, and silicon dioxide; together with the phosphor for "blending colors." However, these patents do not disclose or suggest that dispersants are used in these or similar devices for any benefits other than color mixing or blending or what the desired characteristics of these dispersants are.

UV light-emitting LEDs are particularly preferred in applications in which visible light is extracted because the color of the light emitted by UV LED-based lamps is controlled largely by the phosphor blend since the UV LED chip does not contribute significantly to the visible light emission. As used herein, the term "UV LEDs" means LEDs that emit UV radiation having wavelengths less than or equal to about 420 nm. However, as the wavelengths of radiation emitted by the LED becomes shorter, and the radiation, thus, becomes more energetic, there is an increasing need to ensure that UV radiation preferably does not escape substantially from the lighting device into the surrounding environment.

U.S. Pat. Nos. 5,813,752 and 5,813,753 disclose a UV/blue LED-phosphor device that emits visible light. In U.S. Pat. No. 5,813,752 the UV/blue LED is disposed on a sapphire substrate and a phosphor layer is applied directly on the UV/blue LED. A long-wave pass ("LWP") filter preferably composed of a multilayer dielectric stack of alternating materials having high and low refractive indices is disposed directly on the phosphor layer. In U.S. Pat. No. 5,813,753 the UV/blue LED is disposed in a cup. In both patents, the UV/blue LED emits radiation in the UV-to-blue wavelength range. The cup is filled with an epoxy having a UV/blue-excitable phosphor dispersed therein that converts part of the UV/blue radiation to visible light. A LWP filter, preferably composed of alternating layers of dielectric materials having high and low refractive indices, is disposed on top of the phosphor layer. The LWP filter is believed to reflect UV/blue light back to the phosphor and to transmit visible light emitted by the phosphor. However, these patents do not teach the selection of the materials having high and low refractive indices, the design, or the construction of the multilayer LWP filter to achieve these goals. Material selection is among the critical considerations for the success of such a filter in a device of this nature because the effectiveness of the filter in reflecting UV radiation depends, among other things, on the refractive index of the layer disposed adjacent to the epoxy layer relative to the refractive index of the epoxy.

Therefore, there still is a need to provide improved UV-radiation reducing filters and improved UV LED-based lighting devices that allow only a minimum amount of UV radiation leakage to the surrounding environment. In addition, it is also very desirable to provide a light source that has uniform color and light intensity and at the same time low UV radiation leakage.

SUMMARY OF INVENTION

The present invention provides UV reflectors comprising materials that scatter or reflect UV radiation having wavelengths less than or equal to about 420 nm so that its transmission in the forward direction is reduced compared to the transmission of light having other wavelengths, especially light having wavelengths in the visible spectrum. Generally, a UV reflector of the present invention is made of a composite material of at least two materials having different refractive indices. In a first embodiment, the UV reflector is a composite structure of a first material in a particulate form substantially dispersed in a second solid material that is substantially transparent with respect to light of the visible spectrum. In a second embodiment, the UV reflector is a layered structure of materials having at least two different refractive indices. The refractive index of a first material is less than or equal to and that of a second material is greater than the refractive index of the medium through which light travels before impinging on the UV reflector.

The present invention also provides UV-based light sources having a uniform color and light intensity and reduced UV radiation leakage. The UV-based light source comprises a LED emitting UV radiation, a shaped structure that comprises a molding or casting material covering the LED, particles of at least one phosphor that is excitable by the UV radiation emitted by the LED and particles of at least one UV-radiation scattering material dispersed substantially uniformly in at least a portion of the molding or casting material. The particles of the phosphor composition and the scattering material are disposed in the vicinity of the LED. The molding or casting material may be a glass or a polymeric material that is substantially transparent after curing. As used herein, a substantially transparent material is defined as one that transmits greater than 80% of incident light having a wavelength of 555 nm at an incident angle of less than 10 degrees.

In another aspect of the present invention, the UV-radiation scattering material has a refractive index substantially different from that of the molding or casting material. The refractive index or index of refraction of a material, as referred to herein, is that measured for light having the wavelength of 555 nm.

In another aspect of the present invention, the UV-radiation scattering material is a dielectric material of which greater than 95% of a representative population of particles has particle diameters less than about half of the maximum wavelength of UV radiation in the molding or casting material and which has a mean particle diameter less than about one-tenth of the same wavelength. The diameter of a particle having irregular shape is defined herein as the diameter of a sphere equaling the largest dimension of the particle. The mean particle diameter is the average particle diameter of a representative sample of the particles.

In another aspect of the invention, the UV-based light source further comprises a UV reflector that comprises a plurality of layers of materials having at least alternating first and second refractive indices and that is disposed on the shaped structure of a molding or casting material. The first refractive index is greater than about 1.5, and the second refractive index is less than about 2. Each of the layers has a thickness of one-quarter or an even multiple of one-quarter of the wavelength of the radiation to be transmitted.

In still another aspect of the present invention, the surface of the UV reflector adjacent to the molding or casting material has a plurality of protrusions that have a typical dimension of much less than the wavelength of UV radiation in the molding material.

Other features and advantages of the present invention will be apparent from a perusal of the following detailed description of the invention and the accompanying drawings in which the same numerals refer to like elements.

DETAILED DESCRIPTION

Visible light sources based on UV LEDs typically comprise a phosphor composition disposed adjacent to a LED to convert the UV radiation to visible light. The phosphors used in the present invention absorb UV radiation energy and reemit light having longer wavelengths, typically in the visible spectrum. The combination of the UV LED and the phosphor is typically enclosed in a substantially transparent shaped structure of a molding or casting material, such as glass, epoxy, silicone, or urea formaldehyde thermoset resin. Alternatively, the phosphor particles are often dispersed in the molding or casting material to provide a better dispersion of light. Typically, the amount of phosphor particles used is small. Therefore, there is a considerable probability for UV light to escape from the light source without being absorbed and converted by the phosphor particles. This unconverted UV radiation not only lowers the light output of the light source but also presents a safety concern. Moreover, UV radiation often has adverse effect on the long-term integrity of polymeric molding or casting materials because UV radiation often degrades polymeric materials. Therefore, it is very desirable to reduce the amount of unconverted UV radiation traversing the polymeric material. The present invention provides light sources based on UV LEDs that have increased utilization of UV radiation and reduced UV radiation leakage into the surroundings by increasing the opportunity for UV radiation to scatter within the polymeric material and/or to reflect at the viewing boundary of the light source.

Figure 1:
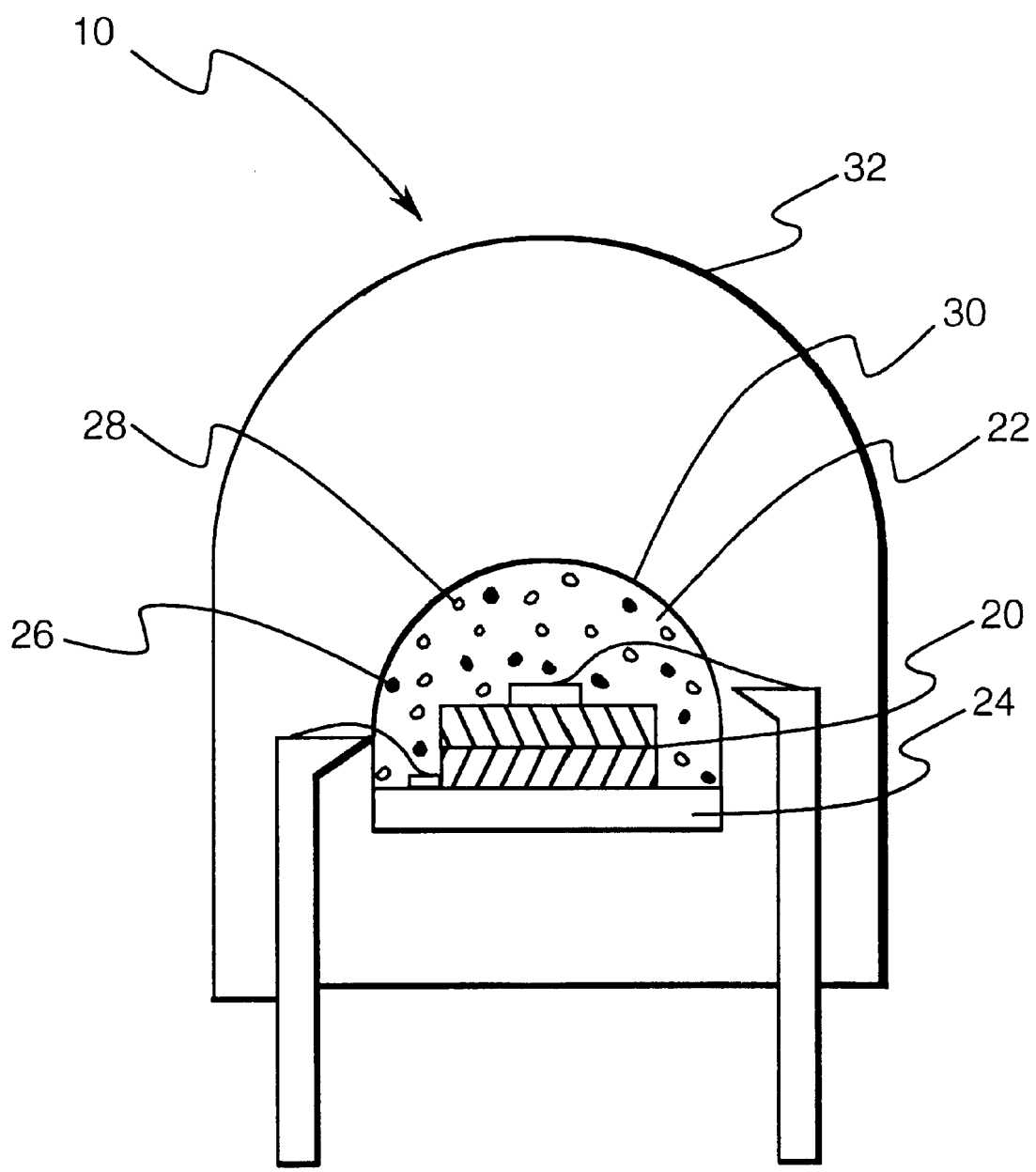
FIG. 1 schematically shows the first embodiment of the present invention wherein the UV reflector comprises a plurality of UV-radiation scattering material dispersed among particles of a phosphor.
Figure 2:
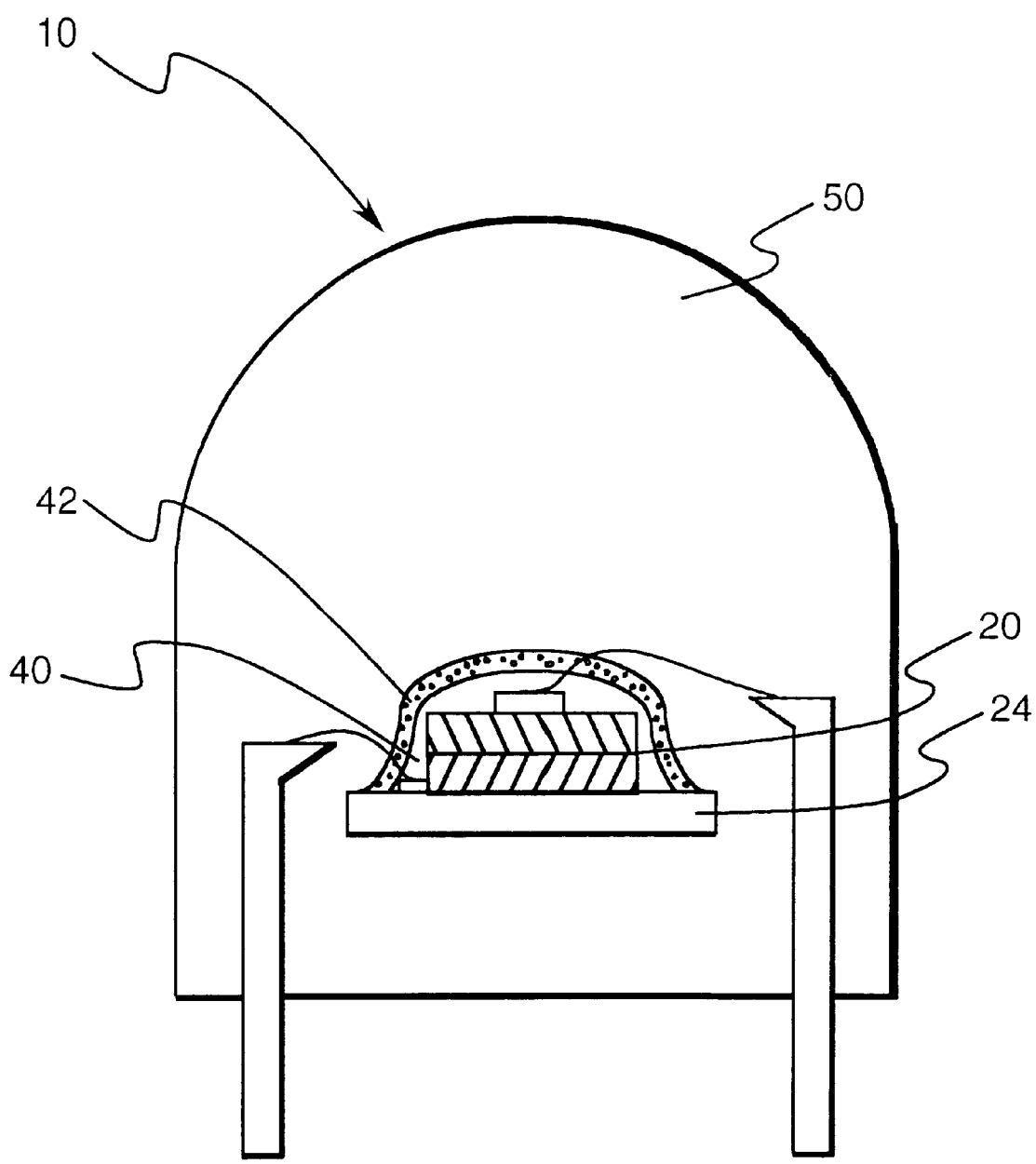
FIG. 2 schematically shows the second embodiment of the present invention wherein the UV reflector is a layer of a UV-radiation scattering material applied over a layer of phosphor.

FIG. 1 shows the first embodiment of the present invention, a light source 10 based on a UV LED comprises a UV LED 20 located on a reflective surface 24, particles 26 of a phosphor composition disposed in the vicinity of the UV LED 20 to convert UV radiation emitted by the LED 20 into visible light, particles 28 of a scattering material disposed among the particles 26 of the phosphor to scatter any UV radiation that is not absorbed initially by the phosphor so to give it further opportunity to be absorbed by the phosphor particles 26. The UV LED 20 emits UV radiation having wavelengths in the range from about 100 nm to about 420 nm, preferably from about 200 nm to about 420 nm, more preferably from about 300 nm to about 420 nm. The particles 26 of the phosphor composition and the particles 28 of the scattering material may be dispersed together in a molding or casting material 22 and an encapsulating structure 30 of the composite of molding material, phosphor, and scattering material is formed over the LED to provide a protective structure thereto. In addition, a lens 32 made of a transparent material may be formed around the structure 30 to provide further protection. The material of the lens 32 may be the same as the molding or casting material of the encapsulating structure 30. In FIG. 1, the reflective surface 24 is shown as a flat surface, but the UV LED 20 may also be located in a cup having a reflective surface. Alternatively, FIG. 2 shows a second embodiment of the present invention, a layer 40 of phosphor material may be applied to the surface of the UV LED 20 from which UV radiation is to emit. A layer 42 of scattering material is applied on top of the phosphor layer 40. Each of the phosphor and scattering layers 40 and 42 may comprise a mixture of the molding or casting material and the phosphor or scattering material. The phosphor layer 40 may also contain particles of a scattering material. Then, the LED 20 with the phosphor and scattering layers 40 and 42 is sealed inside an encapsulating structure 50 of the molding or casting material. Alternatively, the encapsulating structure 50 may be molded or cast separately and then attached to the LED 20 on which the phosphor and scattering layers 40 and 42 have been applied. In either configuration, any UV radiation that is not absorbed by the phosphor material is scattered by the scattering particles and is reflected back to the phosphor material for further absorption and conversion to visible light. Thus, the amount of UV radiation leakage to the surroundings is significantly reduced. In addition, because a larger fraction of the UV radiation is eventually converted to visible light, the light output of the light source is higher than otherwise possible, and since the UV light undergoes multiple scattering events, the visible light output is more uniformly distributed.

Figure 3:
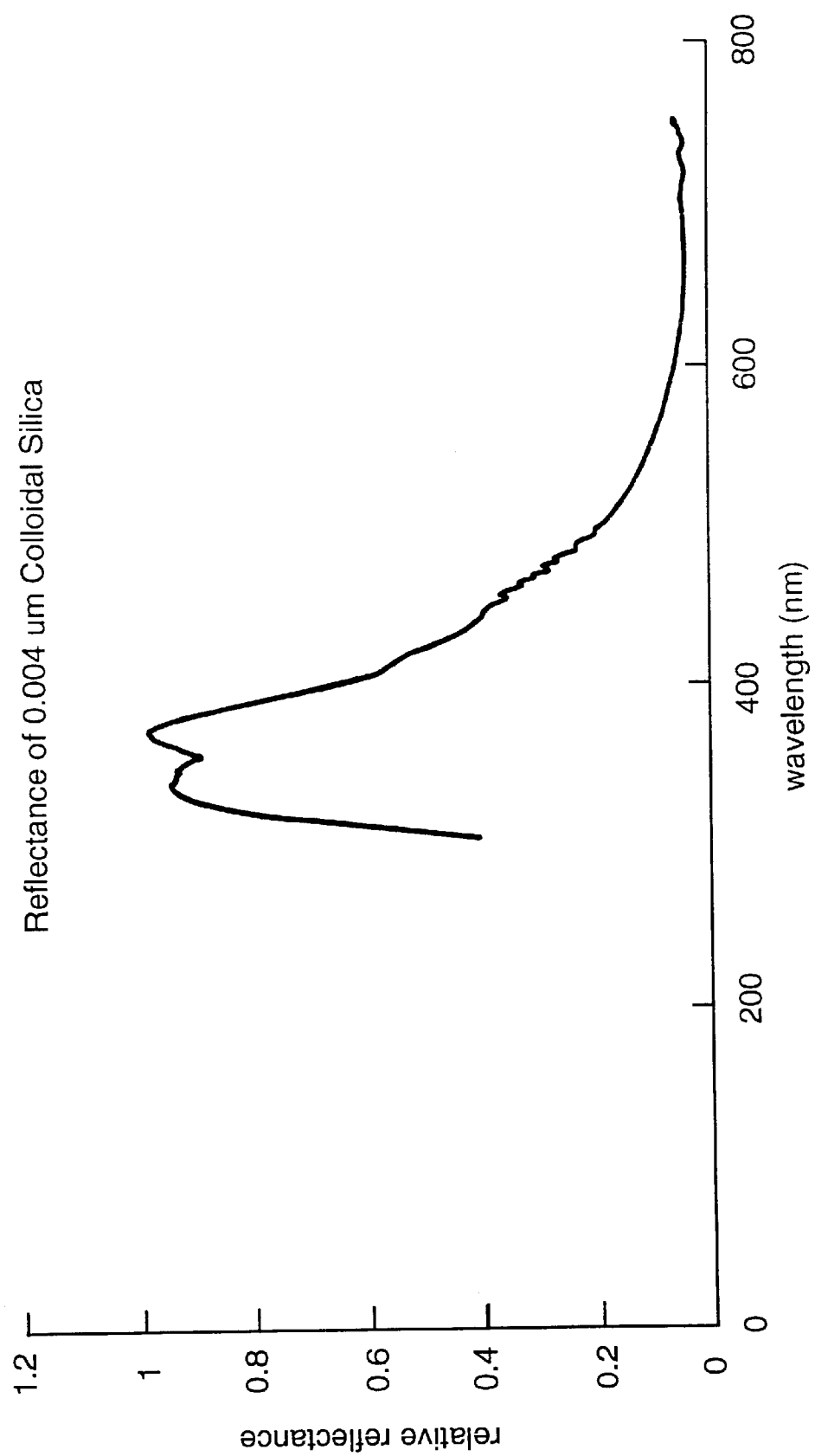
FIG. 3 shows the relative reflectance of 4 nm sized colloidal silica with respect to wavelength.

FIG. 3 shows the relative reflectance of 4 nm colloidal silica particles (refractive index of about 1.4) in water (refractive index of about 1.3). Particles having a characteristic dimension less than about one-tenth of the light wavelength fall within the region in which the Raleigh scattering theory applies. In this region, for non-absorbing particles, scattering is the dominant mechanism.

The intensity of scattered light in this case varies as $\lambda^{-4}$, where $\lambda$ is the wavelength of light. See; for example, Richard Tilley, "Colour And the Optical Properties of Materials," John Wiley & Sons Ltd, pp. 110–113 (2000). In other words, when the scattering material is non-absorbing and the particles have a characteristic dimension, such as diameter, less than one-tenth of an average wavelength, light of shorter wavelengths is scattered more efficiently than light of longer wavelengths. Therefore, it is preferable to use scattering particles of dielectric materials having a mean particle diameter of less than about 40 nm to scatter UV radiation.

It is well known that for Raleigh scattering, the intensity of scattered light is proportional to $[(m^{-1})/(m^2+2)]^2$, where m is the ratio of the refractive index of the particle $n_p$ and that of the medium $n_m$, or $n_p/n_m$. See; for example, Richard Tilley, "Colour And the Optical Properties of Materials," John Wiley & Sons Ltd, pp. 110–113 (2000). Therefore, the intensity of scattered light increases as the ratio m increasingly deviates from 1. Most materials suitable for use as molding or casting materials have refractive indices of about 1.5. Many crystalline solids, including phosphors, have refractive indices substantially higher than 1.5 and are suitable as scattering materials. A few solid halides have refractive indices less than 1.5. Examples of suitable scattering materials for the present invention along with their refractive indices are shown in Table 1 below. Values for refractive indices of some materials may be found in, for example, Ronald W. Waynant and Marwood N. Ediger (Ed.), "Electro-Optics Handbook," McGraw-Hill, Inc., pp. 1.13–11.38 (2000); Eugene Hecht, "Optics," Addison Wesley Longman, pp. 72–73 and 94 (1998); Warren J. Smith, "Modern Optical Engineering," McGraw-Hill, Inc., pp. 189–201. Other materials that have refractive indices greater than about 1.7 or less than about 1.4 are also preferred.

TABLE 1

| Material | Approximate Refractive Index in the UV-Visible Range |
| --- | --- |
| Lead telluride | 5.7 |
| Lead selenide | 4.7 |
| Lead sulfide | 4.1 |
| Germanium | 4.0 |
| Gallium phosphide | 3.5 |
| Silicon | 3.4 |
| Indium arsenide | 3.4 |
| Gallium arsenide | 3.3 |
| Aluminum arsenide | 2.9 |
| Rutile (TiO$_2$) | 2.9 |
| Boron phosphide | 2.8 |
| Cadmium sulfide | 2.7 |
| Calcium telluride | 2.7 |
| Zinc telluride | 2.7 |
| Thallium bromoiodide | 2.6 |
| Calcite (CaCO$_2$) | 2.6 |
| Silicon carbide | 2.6 |
| Cadmium lanthanum sulfide | 2.6 |
| Strontium titanate (SrTiO$_2$) | 2.5 |
| Thallium chlorobromide | 2.4 |
| Diamond | 2.4 |
| Fabulite (SrTiO$_2$) | 2.4 |
| Zinc selenide | 2.4 |
| Cadmium selenide | 2.4 |
| Gallium nitride | 2.4 |
| Aluminum nitride | 2.2 |
| Lithium niobate | 2.2 |
| Potassium niobate | 2.2 |
| Tantalum pentoxide | 2.2 |
| Germanium oxide | 2.2 |
| Silver chloride | 2.2 |
| Hafnium oxide | 2.1 |
| Lithium iodate | 1.9 |
| Zircon (ZrO$_2$SiO$_2$) | 1.9 |
| Yttrium oxide | 1.9 |
| Silicon monoxide | 1.9 |
| Sapphire (single crystal Al$_2$O$_3$) | 1.8 |
| Cesium iodide | 1.8 |
| Lanthanum flint glass | 1.8 |
| Cesium bromide | 1.7 |
| Sodium iodide | 1.7 |
| Magnesium iodide | 1.7 |
| Dense flint glass | 1.7 |
| Lanthanum trifluoride | 1.6 |
| Silica (SiO$_2$) | 1.4–1.5 |
| Lithium fluoride | 1.4 |
| Magnesium fluoride | 1.4 |
| Potassium fluoride | 1.4 |
| Sodium fluoride | 1.3 |

Figure 4:
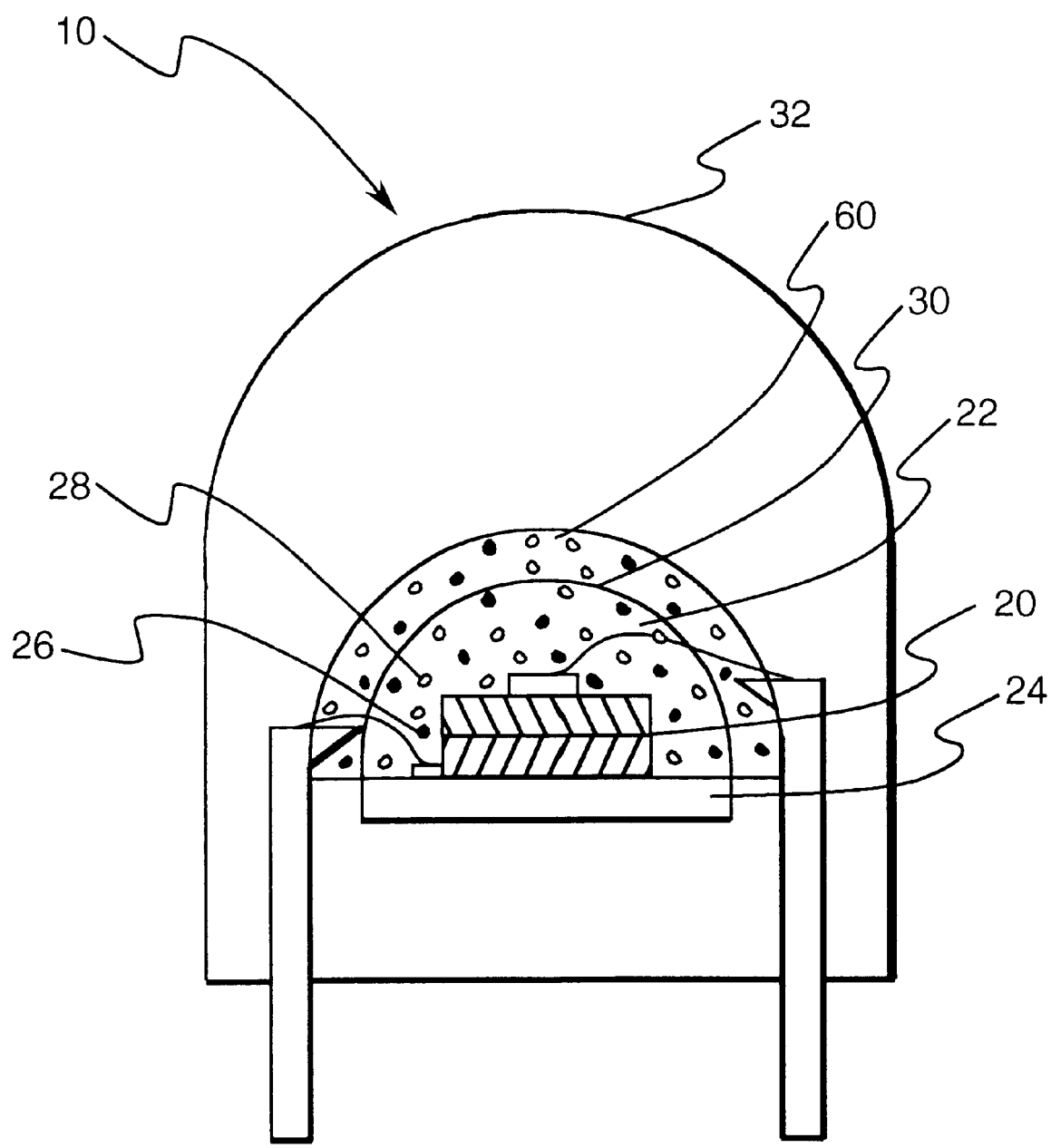
FIG. 4 schematically shows a UV LED-based light source of the present invention with a UV reflector comprising a layer of UV-radiation scattering material disposed on another layer that comprises both phosphor and scattering material.

In another embodiment of the present invention as shown in FIG. 4, the light source of FIG. 1 further includes a layer 60 of at least one scattering material disposed on the encapsulating structure 30. The scattering layer 60 may comprise the same or different scattering material than that dispersed in the encapsulating structure 30. Furthermore the scattering material of layer 60 may be dispersed in the same material as or different material than the molding or casting material of the encapsulating structure 30, as long as it does not substantially affect the visible light transmission. The scattering layer 60 further scatters any unabsorbed UV radiation that may escape conversion to visible light in the encapsulating structure back to the phosphor material, resulting in further reduction of UV radiation leakage.

In another embodiment of the present invention, the scattering layer is a layer of a molding or casting material in which air bubbles of nanometer sizes are formed. The low refractive index of air (about 1) relative to that of the molding or casting material promotes an effective reflection of light at the interface between the air bubbles and the surrounding molding or casting material.

Figure 5:
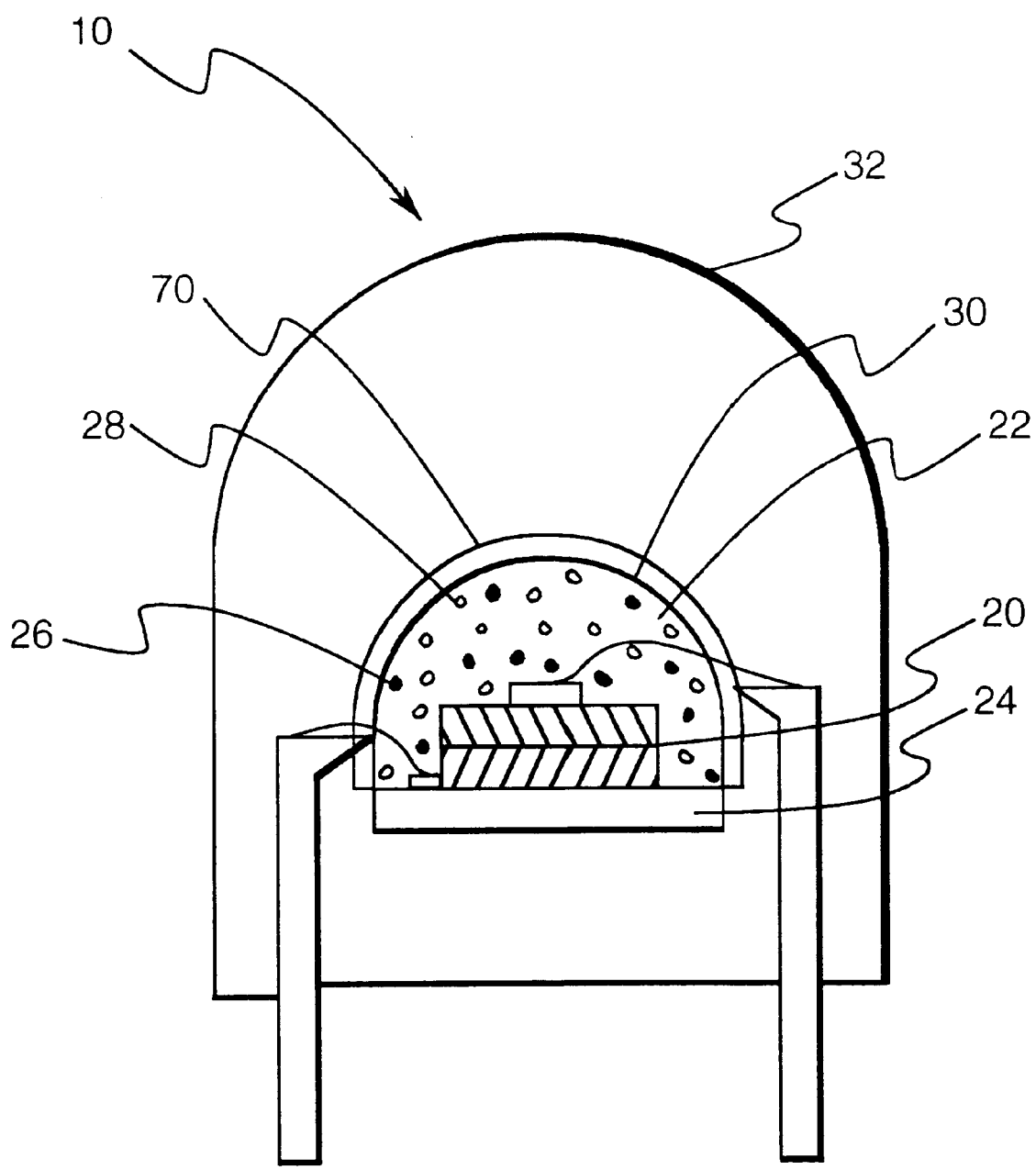
FIG. 5 schematically shows a UV LED-based light source of the present invention including a multilayer UV reflector.
Figure 6:
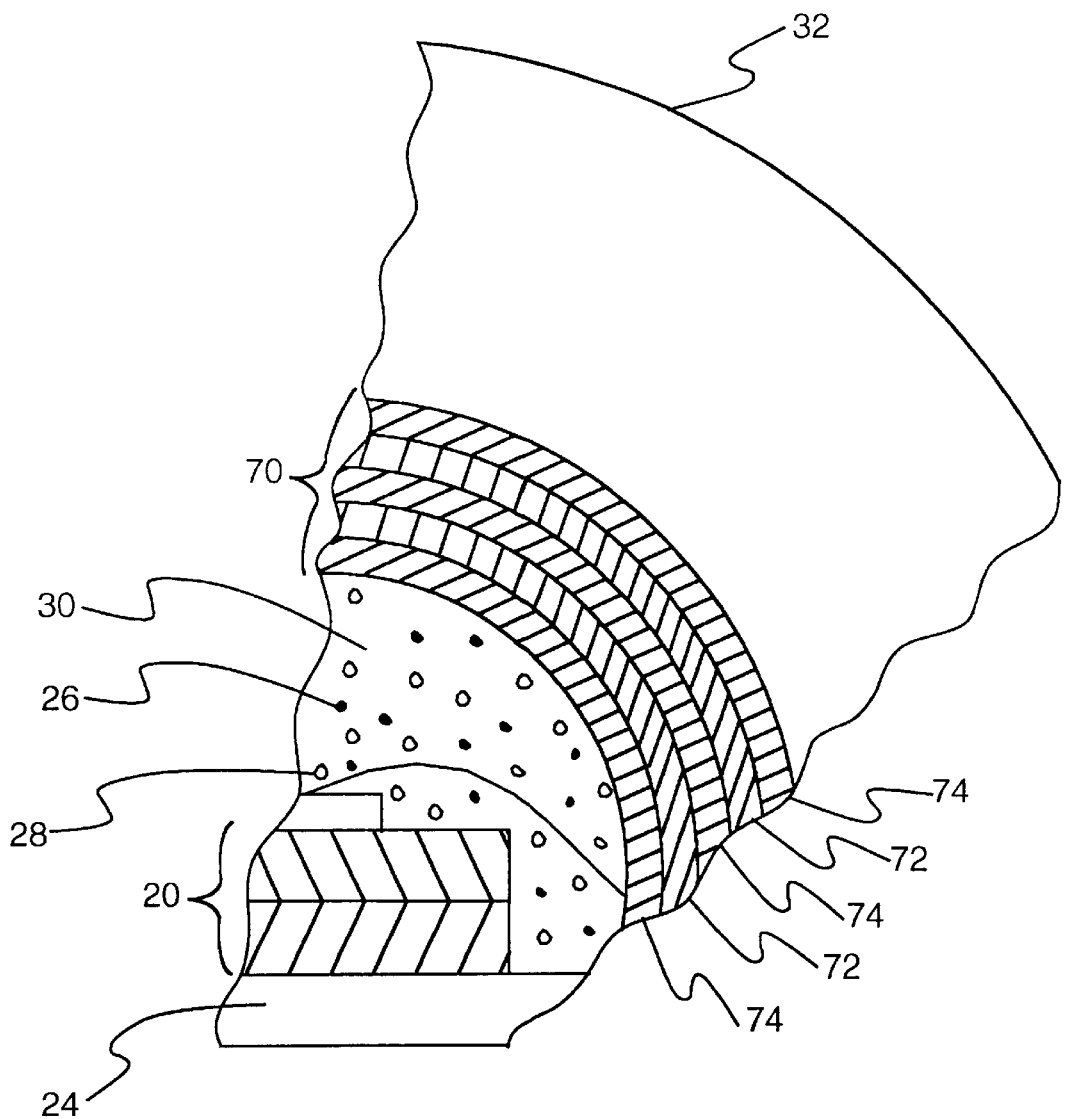
FIG. 6 shows details of the multilayer UV reflector of FIG. 5.

In still another embodiment of the present invention, the UV reflector is a multilayer distributed Bragg reflector ("DBR") 70 that is disposed opposite the LED and away from the phosphor layer in the viewing direction. For example, FIG. 5 shows a DBR 70 disposed on the encapsulating structure 30, which comprises particles 26 of a phosphor and particles 28 of at least a scattering material dispersed in a molding or casting material 22. The DBR 70 is a stack or a series of an odd number of alternating layers 72 and 74 of materials having high and low refractive indices. FIG. 6 shows the DBR 70 in more details. High-refractive index materials are those having refractive indices greater than about 1.5, preferably greater than about 1.7, more preferably greater than about 2, and most preferably greater than about 2.3. Low-refractive index materials are those having refractive indices less than about 2, preferably less than about 1.5, more preferably less than about 1.4, and most preferably less than about 1.3. Materials enumerated above in Table 1 are suitable for the manufacturing of DBRs. For example, high-refractive index materials having index greater than about 1.7 (gleaned from Table 1) are selected from the group consisting of lead telluride, lead selenide, lead sulfide, germanium, gallium phosphide, silicon, indium arsenide, gallium arsenide, aluminum arsenide, rutile, boron phosphide, cadmium sulfide, cadmium telluride, zinc telluride, thallium bromoiodide, calcite, silicon carbide, cadmium lanthanum sulfide, strontium titanate, thallium chlorobromide, diamond, fabulite, zinc selenide, cadmium selenide, gallium nitride, aluminum nitride, lithium niobate, potassium niobate, germanium oxide, silver chloride, hafnium oxide, lithium iodate, zircon, yttrium oxide, silicon monoxide, sapphire, cesium iodide, lanthanum flint glass, cesium bromide, sodium iodide, magnesium iodide, dense flint glass, and mixture thereof. For example, low-refractive index materials having refractive index less than about 2 (gleaned from Table 1) are selected from the group consisting of lithium iodate, zircon, sapphire, cesium iodide, lanthanum flint glass, sodium iodide, magnesium iodide, dense flint glass, silica, lithium fluoride, magnesium fluoride, potassium fluoride, sodium fluoride, and mixtures thereof. Dielectric and non-absorbing materials are preferred. It is well known that the combined reflection of light from two surfaces of a thin film is minimum when the optical thickness of the thin film is equal to one-quarter or an even multiple of one-quarter of the wavelength of the incident light. The optical thickness is the product of the physical thickness t of the film and the refractive index n of the material of the film measured at the wavelength of the transmitted light. In the simplest case, the optical thickness is one quarter of the wavelength of the incident light. It is commonly referred to as a quarter-wave layer. Each of the layers of the DBR 70 preferably has one quarter-wave optical thickness for visible light, for example one-quarter of the light wavelength of 555 nm. Such a film allows a minimum reflection of light most sensitive to the human eyes but more reflection of light having other wavelengths, especially UV light. Therefore, a DBR having multiple quarter-wave layers of appropriate alternating materials will allow more UV radiation to reflect at interfaces between pairs of layers. The number of layers of the DBR 70 should be optimized for a minimum UV radiation leakage and for a maximum visible light transmission. In the preferred embodiment, a DBR comprising an odd number of at least five layers would significantly reduce the amount of UV leakage. However, depending on the circumstances, a DBR may have fewer than five layers. The DBR more preferably comprises an odd number of layers greater than or equal to 11. However, in some circumstances, an even number of layers may also be used. For example, if $n_H$ and $n_L$ denote the high and low refractive index, respectively, the physical thicknesses of the layers of the high and low refractive index are preferably: $t_H=(540 \text{ k nm})/(4 n_H)$ to $(580 \text{ k nm})/(4 n_H)$ and $t_L=(540 \text{ k nm})/(4 n_L)$ to $(580 \text{ k nm})/(4 n_L)$, where k is 1 or a positive even integer number. Furthermore, it is well known that as light travels from a first medium having a refractive index $n_1$ to an adjacent second medium having a refractive index $n_2$ a total reflection occurs when the angle of the incident light made with the normal to the interface at the point where the incident light strikes the interface exceeds a critical angle $\theta c$ that satisfies the equation: $\sin \theta_c=(n_2/n_1)$. As $n_2$ decreases, the critical angle decreases, and, therefore, more light is reflected at the interface between the media. Therefore, if the first quarter-wave layer adjacent to the surface of the encapsulating structure has a refractive index lower than that of the molding or casting material, more UV radiation will be reflected back toward the layer containing the phosphor particles. This layer preferably is made of a material having the lowest refractive index among the chosen materials for the DBR, such as sodium fluoride. The other layers having low refractive indices may comprise the same material or different material than that of the first layer. Moreover, more than one high- and low-refractive index materials may be chosen. In other words, one embodiment of the DBR comprises a plurality of layers of materials having at least alternating first and second refractive indices, wherein said first refractive index is smaller than said second index. Preferably, the first layer in the direction of the incident light comprises a material having the first (lower) refractive index. The DBR in this embodiment further comprises an additional layer having a third refractive index that is less than the first refractive index, said additional layer being attached to said first layer to receive the incident light.

Figure 7:
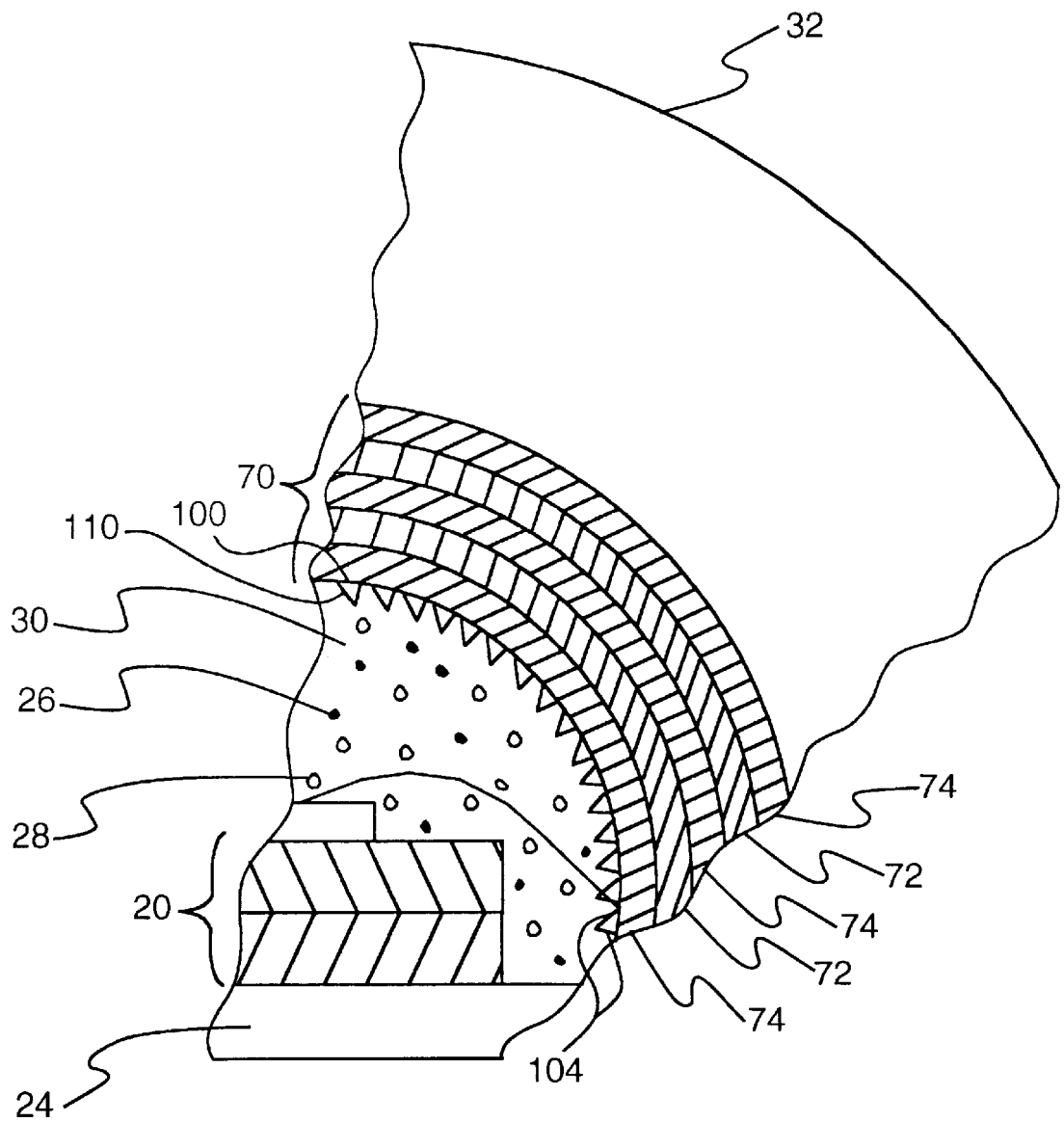
FIG. 7 schematically shows a multilayer UV reflector having protrusions used in a UV LED-based light source of the present invention.

In another embodiment of the present invention as shown in FIG. 7, the surface 100 of the DBR 70 adjacent to the encapsulating structure 30 has a plurality of nanometer-sized protrusions 110 directed toward the LED 20. The protrusions 110 further increase the reflection at the interface 104 between the DBR 70 and the encapsulating structure 30 because the incident angle at a particular protrusion 110 may be larger than the critical angle, while it may have been smaller than the critical angle without the protrusion. The protrusions 110 preferably have a characteristic dimension such as a height or a width that is equal to about a quarter of the wavelength of 555 nm. The protrusions preferably have conical, pyramidal, or hemispherical shape having a height and the largest cross-sectional dimension of the base approximately equal to one quarter of the wavelength.

In one aspect of the present invention, the multilayer DBR is formed by depositing alternating layers of low and high refractive indices on the encapsulating structure surrounding the LED. A first layer of a material having a low refractive index $n_L$ in the range from about 1.05 to about 1.4, such as sodium fluoride, is deposited on the encapsulating structure by physical vapor deposition, chemical vapor deposition, or sputtering to a physical thickness $t_L=(\lambda/4 n_L)$ where $\lambda$ is wavelength of light to be transmitted. $\lambda$ may be chosen to be the wavelength of light most sensitive to the human eyes; i.e., 555 nm. Next, a layer of a material having a high refractive index $n_H$ is deposited on the layer having a low refractive index to a physical thickness of $t_H=(\lambda/4 n_H)$ by physical vapor deposition, chemical vapor deposition, or sputtering. Then, alternating layers having low and high refractive indices are formed successively on a previously formed layer until the desired number of layers is achieved.

In another aspect of the present invention, indentations having conical, pyramidal, or hemispherical shape and having characteristic dimensions of one quarter of the wavelength of yellow light are formed into the surface of the encapsulating structure. A first material having a low refractive index $n_L$ in the range from about 1.05 to about 1.4 is deposited on the encapsulating structure by physical deposition, chemical deposition, or sputtering to fill the indentations and also to further form a first layer having a physical thickness $t_L=(\lambda/4\, n_L)$ where $\lambda$ is the wavelength of the light to be transmitted. $\lambda$ may be chosen to be the wavelength of light most sensitive to the human eyes; i.e., 555 nm. Then alternating layers having high and low refractive indices are formed successively over this layer as described above. It may be advantageous to cover the finished DBR with a thin layer of the molding or casting material to protect the DBR.

Alternatively, the DBR may be formed separately and then subsequently attached to the encapsulating structure either after the complete encapsulating structure has been formed or while it is being formed over the LED. For example, a portion of the encapsulating structure may be formed first. Then the DBR is fixed on that unfinished encapsulating portion. Finally, the encapsulating structure is completed. In this way, the DBR is embedded within the encapsulating structure.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. A UV reflector comprising particles of a UV-radiation scattering material dispersed in a substantially transparent material, said UV-radiation scattering material having a different refractive index than the refractive index of said substantially transparent material, said refractive indices being measured for light having wavelength of 555 nm, wherein said substantially transparent material transmits greater than 80% of incident light having a wavelength of 555 nm at an incident angle of less than 10 degrees.

2. The UV reflector according to claim 1, wherein said scattering material is selected from the group consisting of lead telluride, lead selenide, lead sulfide, germanium, gallium phosphide, silicon, indium arsenide, gallium arsenide, aluminum arsenide, rutile, boron phosphide, cadmium sulfide, cadmium telluride, zinc telluride, thallium bromoiodide, calcite, silicon carbide, cadmium lanthanum sulfide, strontium titanate, thallium chlorobromide, diamond, fabulite, zinc selenide, cadmium selenide, gallium nitride, aluminum nitride, lithium niobate, potassium niobate, germanium oxide, silver chloride, hafnium oxide, lithium iodate, zircon, yttrium oxide, silicon monoxide, sapphire, cesium iodide, lanthanum flint glass, cesium bromide, sodium iodide, magnesium iodide, dense flint glass, lanthanum trifluoride, silica, lithium fluoride, magnesium fluoride, potassium fluoride, sodium fluoride, and mixtures thereof.

3. A UV reflector comprising particles of a UV-radiation scattering material dispersed in a substantially transparent material, said UV-radiation scattering material having a different refractive index than the refractive index of said substantially transparent material, said refractive indices being measured for light having wavelength of 555 nm, wherein said refractive index of said UV-radiation scattering material is less than the refractive index of said substantially transparent material.

4. The reflector according to claim 3, wherein said UV-radiation scattering material is selected from the group consisting of lithium fluoride, magnesium fluoride, potassium fluoride, sodium fluoride, and mixtures thereof.

5. A UV reflector comprising particles of a UV-radiation scattering material dispersed in a substantially transparent material, said UV-radiation scattering material having a different refractive index than the refractive index of said substantially transparent material, said refractive indices being measured for light having wavelength of 555 nm, wherein said UV-radiation scattering material is a particulate dielectric material of which greater than 95% of the particle population has particle diameter less than about half of a maximum wavelength of UV radiation in said substantially transparent material, and which has a mean particle diameter less than about one-tenth of said maximum wavelength of UV radiation in said substantially transparent material.

6. A UV reflector comprising a plurality of layers of materials having at least alternating first and second refractive indices, and an additional layer of a material having a third refractive index less than said first refractive index, wherein said first refractive index is smaller than said second refractive index; a first layer of said plurality of layers comprises a material having said first refractive index, said additional layer being attached to said first layer to receive an incident light having wavelengths in a UV-to-visible spectrum.

7. A UV reflector comprising a plurality of layers of materials having at least alternating first and second refractive indices; wherein said first refractive index is smaller than said second refractive index; a first layer of said plurality of layers comprises a material having said first refractive index, said first layer receiving an incident light having wavelengths in a UV-to-visible spectrum; and each of said plurality of layers has a physical thickness in a range from about 540 k/(4 n) nm to about 580 k/(4 n) nm, wherein k is a positive integer number selected from the group consisting of 1 and positive even integer numbers and wherein n is a refractive index of a material of said layer measured at light wavelength of 555 nm.

8. The UV reflector according to claim 7, wherein said plurality of layers comprises an odd number of layers.

9. The UV reflector according to claim 8, wherein said odd number of layers is greater than or equal to 5.

10. The UV reflector according to claim 8, wherein said odd number of layers is preferably greater than or equal to 11.

11. A UV reflector comprising a plurality of layers of materials having at least alternating first and second refractive indices, and a plurality of protrusions formed on a surface of said UV reflector on which an incident light impinges; wherein said first refractive index is smaller than said second refractive index; and a first layer of said plurality of layers comprises a material having said first refractive index, said first layer receiving an incident light having wavelengths in a UV-to-visible spectrum.

12. The UV reflector according to claim 11, wherein said protrusions are made of the same material as said first layer.

13. The UV reflector according to claim 12, wherein said protrusions have a shape selected from the group consisting of conical, pyramidal, and hemispherical shapes.

14. The UV reflector according to claim 11, wherein said protrusions have a characteristic dimension selected from the group consisting of a height and a width that is equal to a quarter of a wavelength of 555 nm.

15. The UV reflector according to claim 14, wherein said characteristic dimension is a height of said protrusions.

16. The UV reflector according to claim 14, wherein said protrusions have a shape selected from the group consisting of conical, pyramidal, and hemispherical shapes.

17. A UV reflector comprising a plurality of layers of materials having at least alternating first and second refractive indices; wherein said first refractive index is smaller than said second refractive index; a first layer of said plurality of layers comprises a material having said first refractive index; said reflector further comprises an additional layer of a material having a third refractive index less than said first refractive index, said additional layer being attached to said first layer to receive an incident light having wavelengths in a UV-to-visible spectrum; and a plurality of protrusions included on a surface of said additional layer on which said incident light impinges.

18. The UV reflector according to claim 17, wherein said protrusions are made of the same material as said additional layer.

19. The UV reflector according to claim 18, wherein said protrusions have a shape selected from the group consisting of conical, pyramidal, and hemispherical shapes.

20. The UV reflector according to claim 17, wherein said protrusions have a characteristic dimension selected from the group consisting of a height and a width that is equal to a quarter of a wavelength of 555 nm.

21. The UV reflector according to claim 20, wherein said characteristic dimension is a height of said protrusions.

22. The UV reflector according to claim 20, wherein said protrusions have a shape selected from the group consisting of conical, pyramidal, and hemispherical shapes.

23. A light source based on at least one UV LED, said light source comprising:
a LED emitting UV radiation;
a shaped structure that comprises a substantially transparent molding or casting material, said shaped structure covering said LED;
particles of at least one phosphor that is excitable by said UV radiation, said phosphor disposed to receive said UV radiation and to convert said UV radiation to visible light; and
particles of at least one UV-radiation scattering material disposed among said particles of said phosphor;
wherein said particles of said phosphor and said particles of said scattering material are dispersed in at least a portion of said molding or casting material, which transmits greater than 80% of incident light having a wavelength of 555 nm at an incident angle of less than 10 degrees, and said particles are disposed in a vicinity of said LED.

24. The light source based on at least one UV LED according to claim 23, wherein said UV-radiation scattering material has a refractive index different from the refractive index of said molding or casting material, said refractive indices being measured for light having wavelength of 555 nm.

25. The light source based on at least one UV LED according to claim 24, wherein said scattering material is selected from the group consisting of lead telluride, lead selenide, lead sulfide, germanium, gallium phosphide, silicon, indium arsenide, gallium arsenide, aluminum arsenide, rutile, boron phosphide, cadmium sulfide, cadmium telluride, zinc telluride, thallium bromoiodide, calcite, silicon carbide, cadmium lanthanum sulfide, strontium titanate, thallium chlorobromide, diamond, fabulite, zinc selenide, cadmium selenide, gallium nitride, aluminum nitride, lithium niobate, potassium niobate, germanium oxide, silver chloride, hafnium oxide, lithium iodate, zircon, yttrium oxide, silicon monoxide, sapphire, cesium iodide, lanthanum flint glass, cesium bromide, sodium iodide, magnesium iodide, dense flint glass, lanthanum trifluoride, silica, lithium fluoride, magnesium fluoride, potassium fluoride, sodium fluoride, and mixtures thereof.

26. The light source based on at least one UV LED according to claim 24, wherein said refractive index of said UV-radiation scattering material is less than the refractive index of said substantially transparent molding or casting material.

27. A light source based on at least one UV LED, said light source comprising:
a LED emitting UV radiation;
a shaped structure that comprises a substantially transparent molding or casting material, said shaped structure covering said LED;
particles of at least one phosphor that is excitable by said UV radiation, said phosphor disposed to receive said UV radiation and to convert said UV radiation to visible light; and
particles of at least one UV-radiation scattering material disposed among said particles of said phosphor;
wherein said particles of said phosphor and said particles of said scattering material are dispersed in at least a portion of said molding or casting material; said particles are disposed in a vicinity of said LED; said UV-radiation scattering material has a refractive index less than the refractive index of said molding or casting material, said refractive indices being measured for light having wavelength of 555 nm; and said UV-radiation scattering material is selected from the group consisting of lithium fluoride, magnesium fluoride, potassium fluoride, sodium fluoride, and mixtures thereof.

28. A light source based on at least one UV LED, said light source comprising:
a LED emitting UV radiation;
a shaped structure that comprises a substantially transparent molding or casting material, said shaped structure covering said LED;
particles of at least one phosphor that is excitable by said UV radiation, said phosphor disposed to receive said UV radiation and to convert said UV radiation to visible light; and
particles of at least one UV-radiation scattering material disposed among said particles of said phosphor;
wherein said particles of said phosphor and said particles of said scattering material are dispersed in at least a portion of said molding or casting material; said particles are disposed in a vicinity of said LED; said UV-radiation scattering material has a refractive index different from the refractive index of said molding or casting material, said refractive indices being measured for light having wavelength of 555 nm; and said UV-radiation scattering material is a particulate dielectric material of which greater than 95% of the particle population has a particle diameterless than about half of a maximum wavelength of UV radiation in said substantially transparent molding or casting material and which has a mean particle diameter less than about one-tenth of said wavelength.

29. A light source based on at least one UV LED, said light source comprising:
a LED emitting UV radiation;
a shaped structure that comprises a first substantially transparent molding or casting material, said shaped structure covering said LED;
particles of at least one phosphor that is excitable by said UV radiation, said phosphor disposed to receive said UV radiation and to convert said UV radiation to visible light;

particles of at least one first UV-radiation scattering material disposed among said particles of said phosphor; and a layer that comprises particles of a second UV-radiation scattering material dispersed in a second substantially transparent molding or casting material, said layer being disposed on said shaped structure in a direction of a viewer;

wherein said particles of said phosphor and said particles of said first scattering material are dispersed in at least a portion of said first molding or casting material; said particles are disposed in a vicinity of said LED; said first and second UV-radiation scattering materials have refractive indices different from the refractive indices of said first and second molding or casting materials, said refractive indices being measured for light having wavelength of 555 nm.

30. A light source based on at least one UV LED, said light source comprising:

a LED emitting UV radiation;

a shaped structure that comprises a substantially transparent molding or casting material, said shaped structure covering said LED;

particles of at least one phosphor that is excitable by said UV radiation, said phosphor disposed to receive said UV radiation and to convert said UV radiation to visible light; and a plurality of air bubbles having nanometer sizes, said air bubbles being formed among said particles of said phosphor in said substantially transparent molding or casting material;

wherein said particles of said phosphor and said air bubbles are dispersed in at least a portion of said molding or casting material and are disposed in a vicinity of said LED, and said molding or casting material transmits greater than 80% of incident light having a wavelength of 555 nm at an incident angle of less than 10 degrees.

31. A light source based on at least one UV LED, said light source comprising:

a LED emitting UV radiation;

a shaped structure that comprises a substantially transparent molding or casting material, said shaped structure covering said LED;

particles of at least one phosphor that is excitable by said UV radiation, said phosphor disposed in a vicinity of said LED to receive said UV radiation and to convert said UV radiation to visible light, said particles of said phosphor dispersed in a portion of said molding or casting material; and a UV reflector comprising a plurality of layers of materials having at least alternating first and second refractive indices, said first refractive index being smaller than said second refractive index, said UV reflector being disposed on said shaped structure in a direction of a viewer; wherein a first layer of said plurality of layers is disposed adjacent to said shaped structure, and said plurality of layers consists of an odd number of layers.

32. The light source based on at least one UV LED according to claim 31, wherein said first refractive index is smaller than the refractive index of said molding or casting material, and said second refractive index is greater than the refractive index of said molding or casting material.

33. The light source based on at least one UV LED according to claim 31, wherein said first refractive index is preferably less than about 1.5, more preferably less than about 1.4, and most preferably less than about 1.3; and said second refractive index is preferably greater than about 1.7, more preferably greater than about 2, and most preferably greater than about 2.3.

34. The light source based on at least one UV LED according to claim 31, wherein said material having said first refractive index is selected from the group consisting of lithium iodate, zircon, sapphire, cesium iodide, lanthanum flint glass, sodium iodide, magnesium iodide, dense flint glass, silica, lithium fluoride, magnesium fluoride, potassium fluoride, sodium fluoride, and mixtures thereof.

35. The light source based on at least one UV LED according to claim 31, wherein said material having said second refractive index is selected from the group consisting of lead telluride, lead selenide, lead sulfide, germanium, gallium phosphide, silicon, indium arsenide, gallium arsenide, aluminum arsenide, rutile, boron phosphide, cadmium sulfide, cadmium telluride, zinc telluride, thallium bromoiodide, calcite, silicon carbide, cadmium lanthanum sulfide, strontium titanate, thallium chlorobromide, diamond, fabulite, zinc selenide, cadmium selenide, gallium nitride, aluminum nitride, lithium niobate, potassium niobate, germanium oxide, silver chloride, hafnium oxide, lithium odate, zircon, yttrium oxide, silicon monoxide, sapphire, cesium iodide, lanthanum flint glass, cesium bromide, sodium iodide, magnesium iodide, dense flint glass, and mixture thereof.

36. The light source based on at least one UV LED according to claim 31, wherein said first layer of said plurality of layers comprises a material having said first refractive index, said first layer receiving an incident light traversing said shaped structure.

37. The light source based on at least one UV LED according to claim 31, wherein said UV reflector further comprises an additional layer of a material having a third refractive index less than said first refractive index, said additional layer being attached to said first layer to receive said incident light.

38. A light source based on at least one UV LED, said light source comprising:

a LED emitting UV radiation;

a shaped structure that comprises a substantially transparent molding or casting material, said shaped structure covering said LED;

particles of at least one phosphor that is excitable by said UV radiation, said phosphor disposed in a vicinity of said LED to receive said UV radiation and to convert said UV radiation to visible light, said particles of said phosphor dispersed in a portion of said molding or casting material; and a UV reflector comprising a plurality of layers of materials having at least alternating first and second refractive indices, said first refractive index being smaller than said second refractive index, said UV reflector being disposed on said shaped structure in a direction of a viewer, wherein a first layer of said plurality of layers is disposed adjacent to said shaped structure;

wherein said first layer of said plurality of layers comprises a material having said first refractive index; said first layer receives an incident light traversing said shaped structure; and each of said plurality of layers has a physical thickness in a range from about 540 k/(4 n) nm to about 580 k/(4 n) nm, wherein k is a positive integer selected from the group consisting of 1 and positive even integer numbers and wherein n is a refractive index of a material of said layer measured at light wavelength of 555 nm.

39. A light source based on at least one UV LED, said light source comprising:

a LED emitting UV radiation;

a shaped structure that comprises a substantially transparent molding or casting material, said shaped structure covering said LED;

particles of at least one phosphor that is excitable by said UV radiation, said phosphor disposed in a vicinity of said LED to receive said UV radiation and to convert said UV radiation to visible light, said particles of said phosphor dispersed in a portion of said molding or casting material; and a UV reflector comprising a plurality of layers of materials having at least alternating first and second refractive indices, said first refractive index being smaller than said second refractive index, said UV reflector being disposed on said shaped structure in a direction of a viewer; wherein a first layer of said plurality of layers is disposed adjacent to said shaped structure, said first layer of said plurality of layers comprises a material having said first refractive index, said first layer receives an incident light traversing said shaped structure, and said UV reflector comprises a plurality of protrusions formed on a surface of said UV reflector on which said incident light impinges.

40. The light source based on at least one UV LED according to claim 39, wherein said protrusions are made of the same material as said first layer.

41. The light source based on at least one UV LED according to claim 40, wherein said protrusions have a shape selected from the group consisting of conical, pyramidal, and hemispherical shapes.

42. The light source based on at least one UV LED according to claim 39, wherein said protrusions have a characteristic dimension selected from a height and a width that is equal to about a quarter of a wavelength of 555 nm.

43. The light source based on at least one UV LED according to claim 42, wherein said characteristic dimension is a height of said protrusions.

44. The light source based on at least one UV LED according to claim 35, wherein said protrusions have a shape selected from the group consisting of conical, pyramidal, and hemispherical shapes.

45. The light source based on at least one UV LED according to claim 37 further comprising a plurality of protrusions formed on a surface of said additional layer on which said incident light impinges.

46. The light source based on at least one UV LED according to claim 45, wherein said protrusions are made of the same material as said additional layer.

47. The light source based on at least one UV LED according to claim 46, wherein said protrusions have a shape selected from the group consisting of conical, pyramidal, and hemispherical shapes.

48. The light source based on at least one UV LED according to claim 38, wherein said protrusions have a characteristic dimension selected from the group consisting of a height and a width that is equal to about a quarter of a wavelength of 555 nm.

49. The light source based on at least one UV LED according to claim 48, wherein said characteristic dimension is a height of said protrusions.

50. The light source based on at least one UV LED according to claim 48, wherein said protrusions have a shape selected from the group consisting of conical, pyramidal, and hemispherical shapes.

51. The light source based on at least one UV LED according to claim 31 further comprising particles of a UV-radiation scattering material dispersed among said particles of said phosphor, said particles of said UV-radiation scattering material and said phosphor being dispersed in a portion of said molding or casting material.

52. A light source based on at least one UV LED, said light source comprising:

a LED emitting UV radiation;

a shaped structure that comprises a substantially transparent molding or casting material, said shaped structure covering said LED;

particles of at least one phosphor that is excitable by said UV radiation, said phosphor disposed in a vicinity of said LED to receive said UV radiation and to convert said UV radiation to visible light;

particles of at least one UV-radiation scattering material disposed among said particles of said phosphor, said particles of said phosphor and said particles of said UV-radiation scattering material being dispersed in a portion of said molding or casting material; and a UV reflector comprising:
a plurality of layers of materials having at least alternating first and second refractive indices, said first refractive index being smaller than said second refractive index; and
a plurality of protrusions formed on a surface of said UV reflector adjacent to said shaped structure;

said UV reflector being disposed on said shaped structure in a direction of a viewer.

53. The light source based on at least one UV LED according to claim 52, wherein:

said UV-radiation scattering material has a different refractive index than the refractive index of said molding or casting material;

said UV-radiation scattering material is selected from the group consisting of lead telluride, lead selenide, lead sulfide, germanium, gallium phosphide, silicon, indium arsenide, gallium arsenide, aluminum arsenide, rutile, boron phosphide, cadmium sulfide, cadmium telluride, zinc telluride, thallium bromoiodide, calcite, silicon carbide, cadmium lanthanum sulfide, strontium titanate, thallium chlorobromide, diamond, fabulite, zinc selenide, cadmium selenide, gallium nitride, aluminum nitride, lithium niobate, potassium niobate, germanium oxide, silver chloride, hafnium oxide, lithium iodate, zircon, yttrium oxide, silicon monoxide, sapphire, cesium iodide, lanthanum flint glass, cesium bromide, sodium iodide, magnesium iodide, dense flint glass, lanthanum trifluoride, silica, lithium fluoride, magnesium fluoride, potassium fluoride, sodium fluoride, and mixtures thereof;

greater than ninety-five percent of said UV-radiation scattering particles has particle diameters less than about half of a maximum wavelength of UV radiation traversing said substantially transparent material and said UV-radiation scattering particles have a mean particle diameter less than about one-tenth of said maximum wavelength of UV radiation traversing said substantially transparent material;

said first refractive index of said UV reflector is less than about 1.5 and said second refractive index of said UV reflector is greater than about 1.7;

said plurality of layers comprising an odd number of layers, each of said layers having a physical thickness in a range from about 540 k/(4 n) nm to about 580 k/(4 n) nm, wherein k is a positive integer selected from the group consisting of 1 and positive even integer numbers and where n is a refractive index of a material of said layer measured at a light wavelength of 555 nm;

a first layer of said plurality of layers disposed adjacent to said shaped structure has said first refractive index; and said plurality of protrusions have a shape selected from the group consisting of conical, pyramidal, and hemispherical shapes, and said protrusions have a characteristic dimension selected from the group consisting of a height and a width that is equal to about a quarter of a wavelength of 555 nm.

* * * * *